(12) United States Patent
Ruile

(10) Patent No.: US 6,677,696 B1
(45) Date of Patent: Jan. 13, 2004

(54) SURFACE ACOUSTIC WAVE COMPONENT ON A MONOCRYSTAL SUBSTRATE WHICH IS ALSO PYROELECTRIC

(75) Inventor: Werner Ruile, München (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 09/582,183
(22) PCT Filed: Dec. 22, 1998
(86) PCT No.: PCT/DE98/03769
§ 371 (c)(1),
(2), (4) Date: Sep. 25, 2000
(87) PCT Pub. No.: WO99/35738
PCT Pub. Date: Jul. 15, 1999

(30) Foreign Application Priority Data

Dec. 30, 1997 (DE) .......................... 197 58 198

(51) Int. Cl.$^7$ .............................. H01L 41/04
(52) U.S. Cl. .................... 310/313 A; 333/193
(58) Field of Search .............. 310/313 A, 313 R; 333/193–196

(56) References Cited

U.S. PATENT DOCUMENTS

| 4,484,098 A | 11/1984 | Cullen et al. |
| 4,952,832 A | 8/1990 | Imai et al. |
| 5,296,824 A * | 3/1994 | Cho et al. .................... 333/193 |

FOREIGN PATENT DOCUMENTS

| DE | 28 02 946 | 8/1978 |
| DE | 196 41 662 | 4/1997 |
| EP | 0 534 252 | 3/1993 |
| EP | 0 785 620 | 7/1997 |
| EP | 0 790 705 | 8/1997 |
| EP | 0 820 143 | 1/1998 |
| GB | 2 088 167 | 6/1982 |
| JP | 56-162522 | 12/1981 |
| JP | 62-98811 | 5/1987 |

OTHER PUBLICATIONS

XP–002103219—24(1985) supp. No. 24, Part 1, Tokho, Japan—High Velocity and High Coupling Surface Acoustic Waves Using ZnO Films on Ceramic Substrates with High Acoustic Velocity.

High Velocity Pseudo Surface Waves (HVPSAW)—Pereira da Cunha et al—Department of Electrical Engineering, McGill University, 1994 Ultrasonics Symposium.

"Temperature Dependence of SH–Wave on Rotated Y–Cut Quartz with SiO$_2$ Overlay," Fabien Josse, 1984 IEEE.

"Propagation Characteristics of Surface Acoustic Waves in ZnO/LiNbO$_3$ Structures," Nakamura et al, Jpn.J.Appl. Phys. vol. 32 (1993) pp. 2333–2336, Part 1, No. 5B, May 1993.

* cited by examiner

*Primary Examiner*—Mark O. Budd
(74) *Attorney, Agent, or Firm*—Schiff Hardin & Waite

(57) ABSTRACT

A surface acoustic wave component for high power capability has an aluminum electrode structure on a pyro-electric substrate. A surface of the substrate with the electrode structure thereon is a crystal cut surface which is positively electrically charged when the pyro-electric crystal material is heated. A hard layer is also provided on the electrode structures, preferably with a corresponding crystal cut orientation.

63 Claims, 5 Drawing Sheets

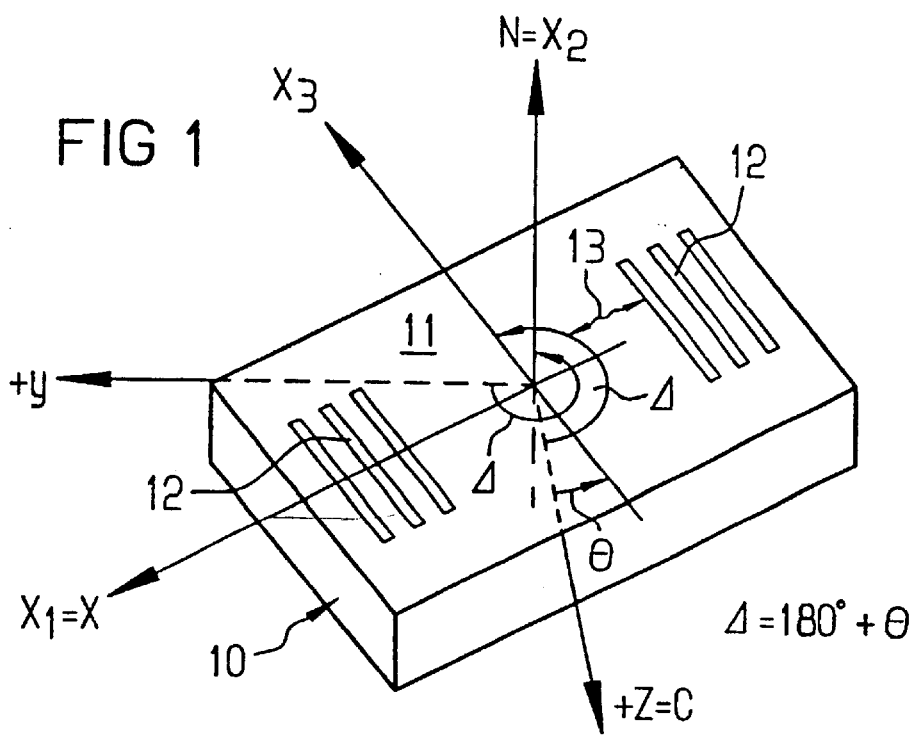
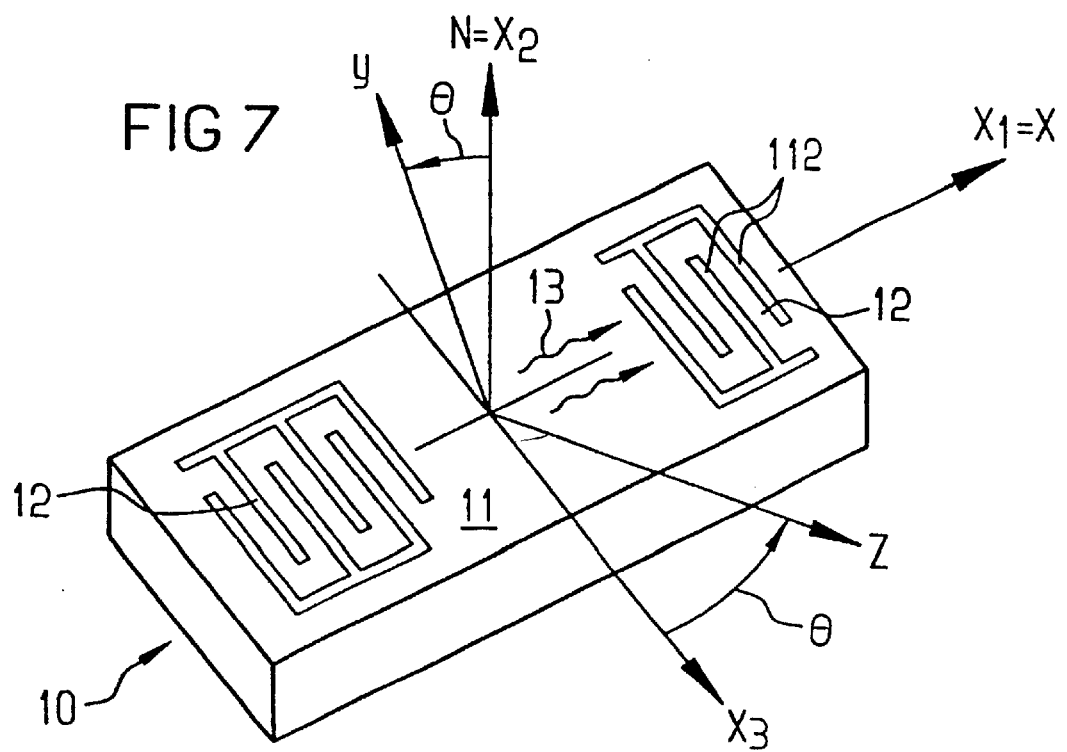

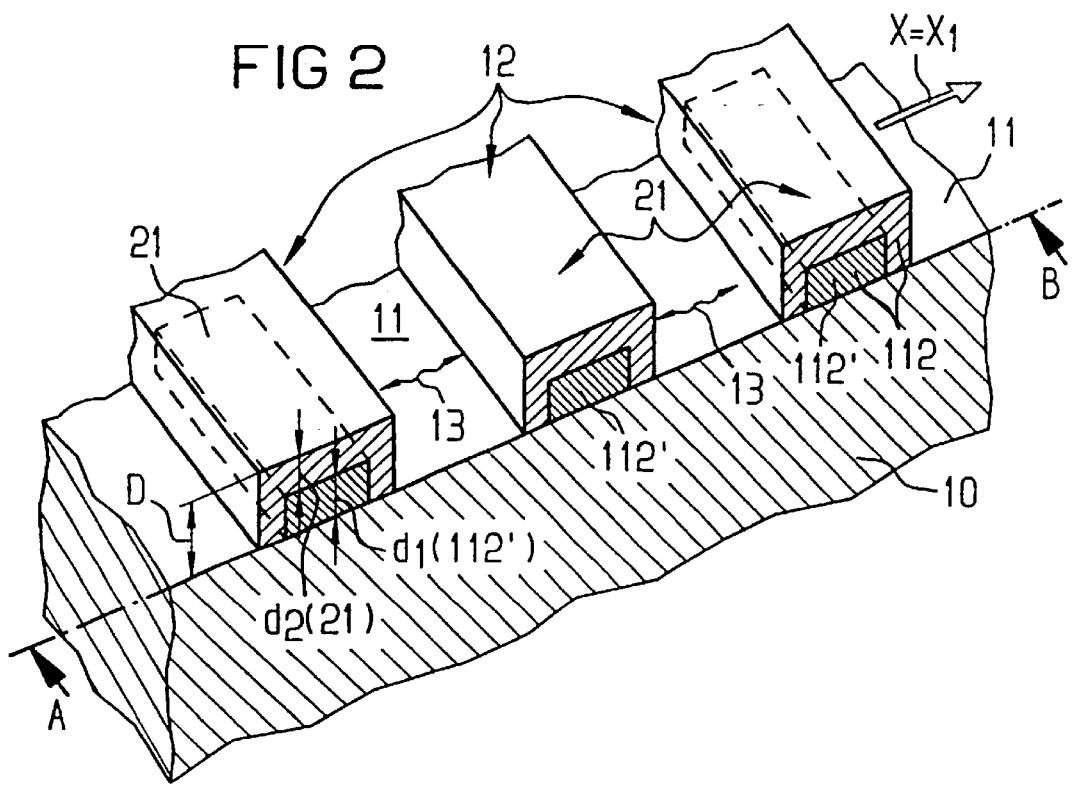
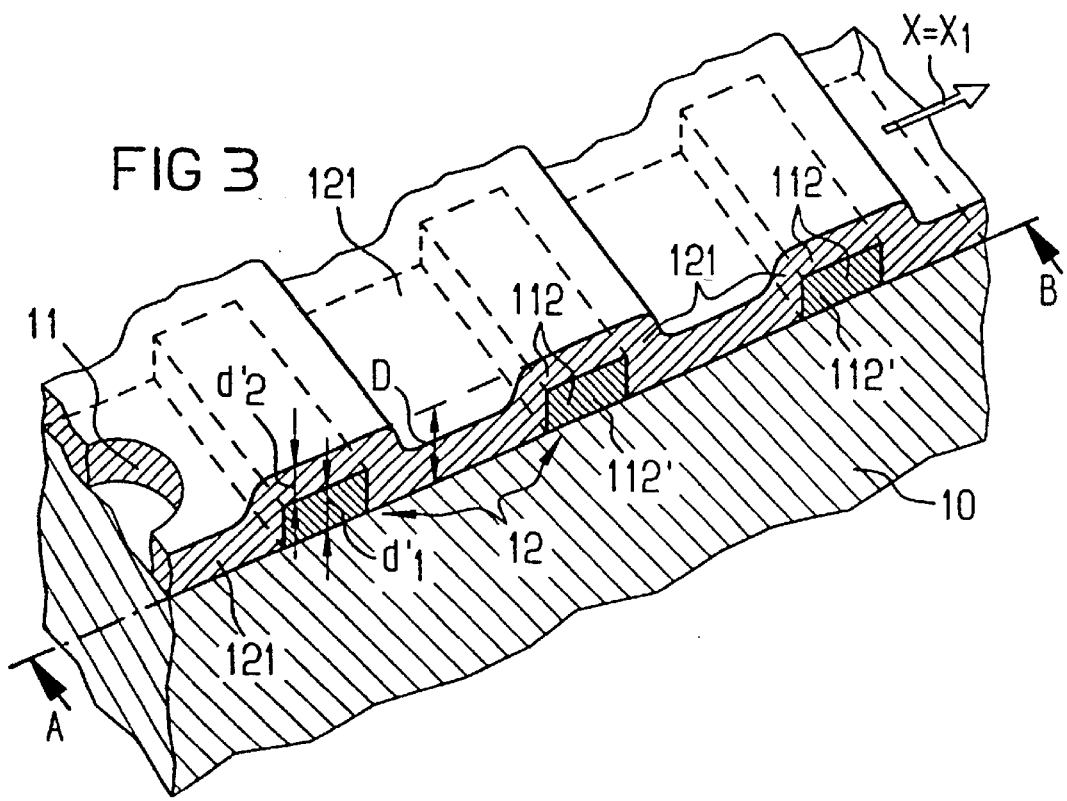

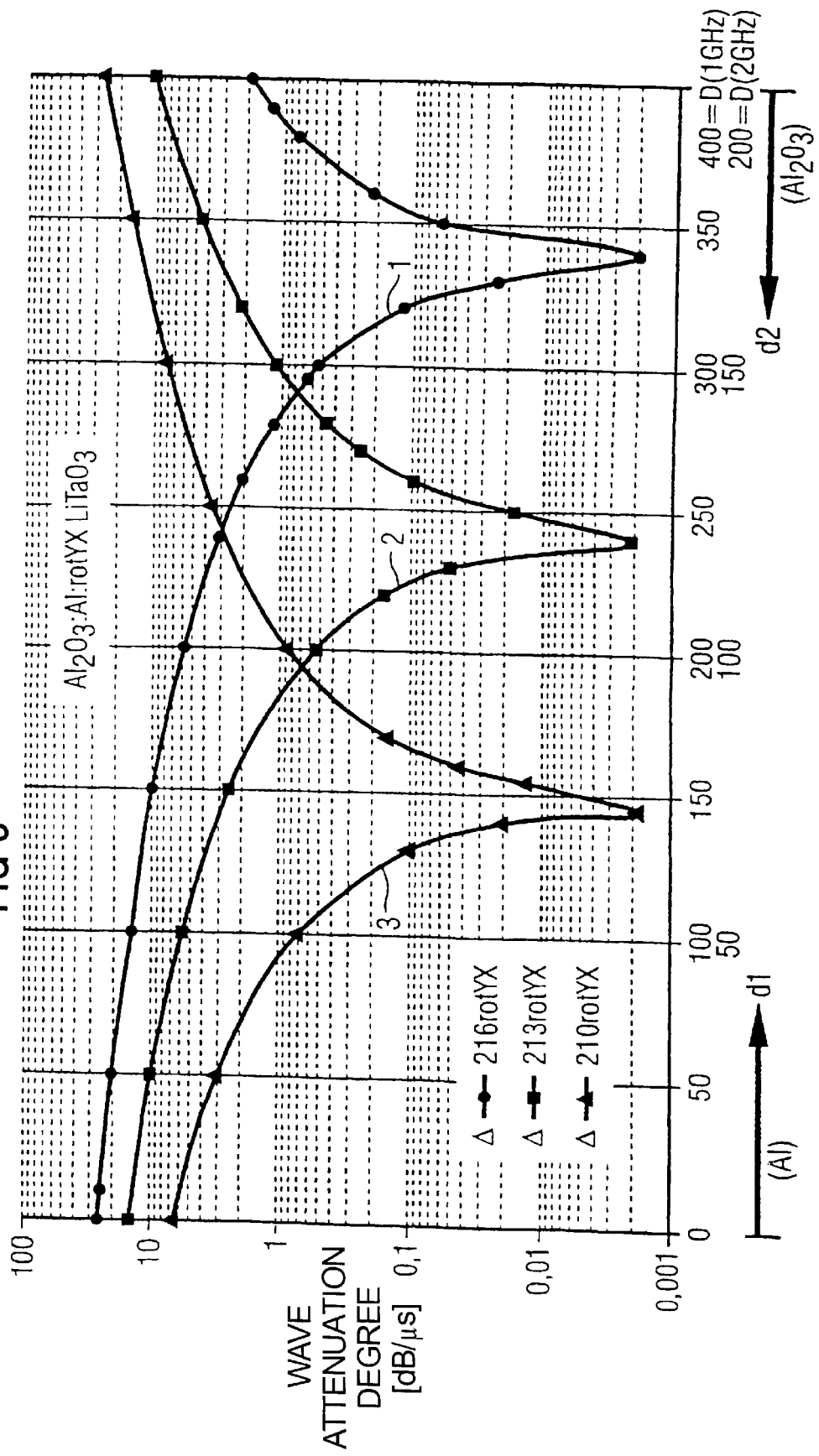

SURFACE ACOUSTIC WAVE COMPONENT ON A MONOCRYSTAL SUBSTRATE WHICH IS ALSO PYROELECTRIC

The present invention is directed to an electronic surface acoustic wave (SAW) component on, in particular, a lithium tantalate/niobate substrate that works with acoustic waves. Without this being respectively repeated, the invention can also be applied for potassium niobate and similar materials employed a substrate crystal for such components.

It is important for the employment and the operation of such a component, particularly for handsets of the mobile radiotelephone field, to preferably design the input/output filter (directly connected to the antenna) such that, on the one hand, it exhibits high power compatibility (for example, 2 Watts offered power) and, on the other hand, particularly has an extremely low insertion attenuation.

An applicable surface acoustic wave filter is disclosed, for example, by DE-A-2802946. It is essentially composed (see FIG. 7) of a piezoelectric substrate lamina 1 such as, for example, lithium tantalate on the selectively oriented substrate surface 2 of which electrode structures 12 such as inter-digital structures and the like are applied. LSAW waves (leaky surface acoustic waves) or HVPSAW(high velocity pseudo) waves proceed between these structures during operation (also see Ultrasonic Symp. Proc. 1994, pp. 281–286). These electrode structures and propagating waves 13 serve for the selective/filtering electrical signal transmission.

It is known for such a reflector/electrode structure (merely referred to overall below as electrode structures) having, for example, interdigital electrode fingers, reflector fingers and the like (also merely referred to overall as fingers below), that it is not only the sequence of the arrangement of the fingers 112 and their spacings that must be adhered to but that a predetermined dimension must also be adhered to (preferably within a range of tolerance) for the thickness (height) of the fingers, namely for adequately high reflectivity of these fingers.

For a high power compatibility, it is known from the Prior Art to provide special techniques for the electrode structures applied on the substrate surface. In general, these electrode structures are composed of, for example, photolithographically structured aluminum. Such structures of pure aluminum are relatively unstable in a number of ways. For enhancing the power compatibility, the aluminum has been alloyed with copper or a sandwich structure of aluminum and copper has been provided. What is thereby disadvantageous is that corrosion occurs given such a combination of materials. Adding titanium to the aluminum leads to higher electrical resistance of an electrode structure composed of this combination. Another approach that has been pursued is to apply the aluminum on the substrate with [11]-texture, a prior nucleation of the deposition surface thereof being required for this purpose. This not only causes higher technological expense, the reproducibility of such a textured aluminum layer leaves much to be desired. Epitaxial growth of the aluminum of an electrode structure is a distinctly expensive manufacturing method. A small grain structure of the aluminum for enhanced power compatibility can also be produced by sputtering the aluminum under correspondingly selected conditions. Disadvantageously, however, the photolithographic lift-off technique that is otherwise advantageous (and is preferably employed for the invention) can thereby not be applied for forming the electrode structure.

The desirable, low insertion attenuation for the component has also been mentioned above. It is known from the Prior Art (DE-A-19641662 and DE-C-2802946) to achieve low insertion attenuation of the surface acoustic wave filter in that a crystal of a section (red y) rotated by an angle $\theta$ is employed as substrate lamina. The substrate lamina 1 has a surface 2 to which an axis system x1, x2, x3, with x2 as the normal N of this surface and with axes x1 and x3 lying in this surface are allocated. The known orientation of the crystallographic axis system x, y, z is such that the x-axis, coinciding with the axis x1, lies in the plane of the crystal section, i.e. in the substrate surface, and this crystallographic x-axis and the direction of the wave propagation 13 in the component are aligned parallel to one another. The y-axis of the crystal in the Prior Art resides on the substrate surface obliquely relative to the normal N thereof in the dimension of the rotational angle $\theta$ corresponding to the rotation (red y). The z-axis therefore assumes the same angle $\theta$ relative to the x1–x3 plane, i.e. to the substrate surface. The aforementioned publications specify an angular range between 38° and 46°, on the one hand, and between 33° through 39°, on the other hand for an angle $\theta$ for the lithium tantalate. Angles with 66° through 74° and 41° are known for the lithium niobate.

SUMMARY OF THE INVENTION

An object of the present invention is to specify a concept of an applicable surface acoustic wave component (filter) that comprises the required power compatibility as presented above and that also preferably has minimized insertion attenuation.

According to the present invention, a surface acoustic wave component is provided comprising an electrode structure formed of fingers having aluminum as at least a principal material constituent on a surface with a surface normal of a pyroelectric and piezoelectric crystal substrate lamina of lithium tantalate. The surface is a crystal section such that the surface charges electrically positive given heating of the substrate lamina as a result of a pyroelectric effect. A crystal section is rotated around an x1=x-axis as a direction of wave propagation with an angle $\Delta=(180°+\theta)$ between a positive y-axis and the surface normal, wherein $\theta$ is a known angle for low leakage wave losses for lithium tantalate crystal sections.

Also according to the invention, a surface acoustic wave component is provided having electrode structures formed of fingers of aluminum as at least a principal material constituent on a surface having a surface normal of a pyroelectric and piezoelectric crystal substrate lamina of lithium niobate. The surface is a crystal section such that said surface charges electrically positive given heating of the substrate lamina as a result of a pyroelectric effect. A crystal section is rotated around an x1=x-axis as a direction of the wave propagation with an angle $\Delta=180°+\theta$ between a positive y-axis and the surface normal, wherein $\theta$ is a known angle for low leakage wave losses for lithium niobate crystal sections.

Also according to the invention, a surface acoustic wave component is provided comprising electrode structures having fingers formed of aluminum as at least a principal material constituent on a surface having a surface normal of a pyroelectric and piezoelectric crystal substrate lamina of potassium niobate. The surface is a crystal section such that the surface charges electrically positive given heating of the substrate lamina as a result of the pyroelectric effect. A crystal section :is rotated around the x1=x-axis as a direction of wave propagation with an angle $\Delta=180°+\theta$ between a positive.y-axis and the surface normal, wherein $\theta$ is a known angle for low leakage wave losses for potassium niobate crystal sections.

The invention is described below on the basis of an example with lithium tantalate monocrystal substrate lamina (without being thereby considered limited thereto).

For achieving this object, a crystallographic orientation of the surface of the employed substrate lamina provided for the electrode structures 12 is selected that deviates significantly from the Prior Art. The +z-axis, which is also the pyroelectrical axis, resides at an angle Δ relative to the x1–x2 plane, i.e. it is directed into the substrate lamina relative to the substrate surface 11 (so that the negative z-axis points up away from the substrate surface in FIG. 1). The x3-axis is rotated counter-clockwise by the angle Δ relative to the +z-axis (as viewed opposite the x1-axis; also see FIG. 1). The same angle Δ is thus also present between the normal N (=x2-axis) and the +y-axis. Preferably, the angle Δ=180°+θ, whereby θ is an angle, in particular, between about 25° and 46°.

For a respective crystal material such as lithium tantalate, lithium niobate, potassium niobate and the like, this angle θ can be selected of the size that is standard in the Prior Art (as described above) for known surface acoustic wave components with a red y crystal section.

What this means in other words is that, compared to the Prior Art, the (parallel) back side of, for example, the respectively known section of the substrate lamina is employed here in the invention as the substrate surface for the electrode structures. This inventive technique that was previously not employed in the Prior Art is a surprisingly advantageous technique (as shall be presented later) in view of the stated object of enhancing the power compatibility of a surface acoustic wave component.

Lithium tantalate and the like is not only a piezoelectric but also a pyroelectric crystal. Due to the alignment of its surface normal N relative to the pyroelectric axis (equal to the Z-axis of the crystal) with the inventively selected angle Δ=(180°+θ), the lamina surface inventively employed for the electrode structures/fingers charges to a positive voltage relative to the substrate lamina or, respectively, relative to its opposite, back surface of the lamina, namely when a heating of the substrate lamina or of at least its surface-proximate region under the electrode structures occurs.

Such a heating in fact occurs when a greater operational stressing of the surface acoustic wave component as an oscillator, filter or the like occurs. This process of heating and the positive charging connected therewith thus particularly and preferably occurs close to the electrode structures in that surface of the substrate lamina that, as inventively provided here (namely differing from the Prior Art), is selected for the application of the electrode structures/fingers.

The effect of actual interest that can be achieved with the invention is that, with the positive charging of the inventively selected surface, negative charges are drawn from the substrate lamina toward this surface. In particular, these are negatively charged oxygen ions. These act in situ on the aluminum of the electrode structures such that a stable aluminum oxide is formed in the influencing region of these oxygen ions. Advantageously for the invention, this aluminum oxide increases the power compatibility of the surface acoustic wave component, particularly the adhesion of the aluminum electrode structure on the inventively selected substrate surface. The self-heating of the component that occurs precisely given high electronic stressing of thereof thus inventively effects an intensified oxidation together with the accompanying advantage.

With the perception of this "internal" action of the invention, the person skilled in the art is in the position to also apply the invention to other pyroelectric crystals that are not cited here, i.e. to apply the standard electrode structure of essentially aluminum on the selected substrate surface that charges positively given heating (occurring during operation) and to thus achieve the increased power compatibility in conformity with the object.

The exact size of the angle Δ (here, 180°+θ with the above-recited dimensions or, respectively, limits for the angle θ) for the alignment of the pyroelectric axis of the (lithium tantalate and the like) crystal with respect to the surface of the substrate lamina employed for the electrode structures is relatively uncritical for this inventive effect of enhanced power compatibility insofar as this does not influence the operational sign of the above-described surface charging, i.e. the effect utilized for the invention. Greater heating due to increased dissipated power even leads to a more pronounced oxidation effect in the aluminum. Corresponding to the selection of the angle θ in view of lower or, minimized leakage wave losses, however, it is nonetheless recommendable in the invention to select such an angular dimension for the angle part θ (in Δ=180°+θ), particularly the known angle values, with which low leakage wave losses are then also aspired to here.

Let the following description of the attached Figures belonging to the specification of the invention be provided for further explanation

BRIEF DESCRIPTION OF THE DRAWINGS

FIG. 1 shows the principle of the inventive crystallographic alignment of the substrate surface with reference to the axis system x1, x2, x3 thereof;

FIGS. 2, 3 and 4 show developments of the invention; and

FIGS. 5, 5a and 6 show explanations directed to the thickness dimensioning; and

FIG. 7 shows the Prior Art.

DESCRIPTION OF THE PREFERRED EMBODIMENTS

Figure 4:
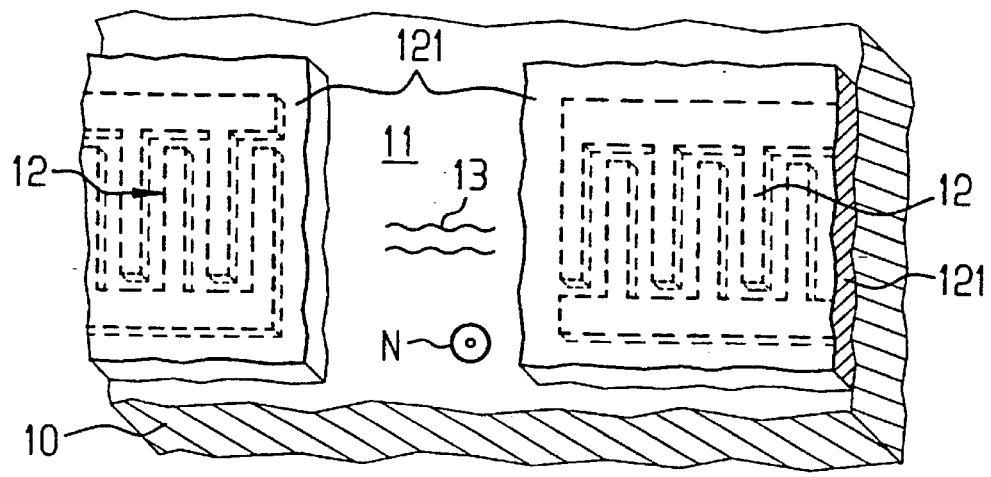

FIG. 1 shows the surface 11 of the substrate lamina 10 with the particulars of the orientations of the attitude of the crystal axes x, y, z of the ;exemplary lithium niobate crystal referred to this surface 11 (plane of section of the crystal). The normal N of the substrate surface 11 is additionally shown. This surface 11 is a y-section rotated around the x-axis with the indicated, inventive alignment of the crystal direction y and the corresponding, indicated alignment of the z- (c-) crystal/pyro-axis of the lithium tantalate. As can be seen, this z-axis in the perspective illustration of FIG. 1 is directed down into the substrate lamina 10 and has the inventively dimensioned angle Δ=180°+θ with an angle θ between, for example, 25° through 46°, preferably between 33 ° and 37°, relative to the (x1–x3-) plane of the substrate surface 11. For lithium niobate, these are angles between 60° and 74° as well as between 33° and 47°. In particular, the angle θ can have the dimension of the angle θ recited in the Prior Art for minimal insertion attenuation with reference to the respective crystal material. This angle Δ, moreover, also occurs as rotational angle of the (positive) y-axis relative to the normal N of the substrate surface, corresponding to the rotation red y of the crystal section around the x=x1-axis.

FIGS. 2 through 4 and FIGS. 5 and 6 for explanation thereof show developments of the invention that are comprised in a hard layer 21, 121 generated in the surface of the electrode structures 12/fingers 112 or, respectively, applied on this surface, namely relative to the aluminum or the like of the electrode structures. This technique can be advantageously additionally provided for the object-conforming optimization of the power compatibility given the present invention with substrate lamina having the rotation by the angle Δ.

An aluminum oxide layer can be provided on the aluminum electrode structures as the hard layer to be provided here. In particular, this aluminum oxide layer can be effected on the aluminum of the electrodes by anodic oxidation proceeding from the surface of the electrode structure into the aluminum thereof. The preferred thickness of this inventive, hard layer lies between 50 nm and 500 nm. Such a dimension of the hard layer lies at about 10% through 80% of the thickness of the electrode structure with the layer on the substrate.

A generally valid physical definition for the term "hard" is that the speed of sound in this material is (for example, about 80%) higher for the relevant acoustic wave provided in the component than the speed of sound in the electrically conductive material of the electrode structure, i.e. the aluminum or, respectively, aluminum alloy part thereof. For example, the speed of sound for a shear-polarized (LSAW) wave amounts to about 5300 m/3 in aluminum oxide and to only about 3000 m/s in aluminum.

In order to achieve a more enhanced power compatibility, an adequately thick layer of this hard layer defined here is required on the electrode structure or, respectively, as an integral component part thereof. It is important to note and consider for the invention that—differing from the passivation layers that are known to be provided on surface acoustic wave components—the thickness of the material of the inventively provided, hard layer is to be dimensioned as a part of the overall layer thickness of the electrode structure/finger to be provided as known for the required, acoustic reflection effect. For example, a finger thickness of approximately 400 nm is prescribed as advantageously physically adapted for an LSAW wave in the 1 GHz range (2 GHz= approximately 200 nm). For the increased power compatibility of the stated object, a particular aim is that a resulting speed of sound deriving in practice for the surface acoustic wave from the speed of sound values of the electrode material and of the inventively provided, hard layer (for example, aluminum oxide) is approximately equal to the speed of sound of the wave in the substrate material. (For the lithium tantalate/niobate that is relevant here, this speed of sound amounts to approximately 4000 m/s.) Inventively, thus, a thickness relationship between the thickness of the inventively provided, hard layer and the electrically conductive material of the electrode structure corresponding to the above is additionally selected such that the overall thickness (hard layer+conductive material), for example for the above example 1 GHz, amounts to 400 nm. In accord therewith, for example, 150 nm aluminum oxide on 250 nm aluminum (alloy) derive as inventively dimensioned thickness relationship within the above "overall thickness".

Let it be noted regarding the aforementioned overall thickness of the electrode structure that this thickness dimension can amount to between 3% and 15% of the wavelength of said surface acoustic waves, but typically lies at about 10% (=400 nm given approximately 1 GHz).

This development of the invention can also include a further feature for achieving the object of higher/optimized power compatibility. This is to provide a selection of the aforementioned angle of the rotated (red y) crystal section that is also adapted to the hard layer. For optimum usable high-frequency power compatibility, namely, it has been found that there is a dependency—namely dependent on one another—of, on the one hand, the inventively selected thickness ratio recited above (hard layer to electrically conductive part of the fingers) and, on the other hand, the selection of the (angular part θ of the) angle Δ for the surface with the normal N of the substrate lamina. Let the later description of FIGS. 5 and 6 be referenced for further explanation thereof.

A way other than anodic oxidation for generating an inventively provided hard layer on electrode structures also composed of electrically conductive material other than aluminum and, potentially, on the regions surrounding them as well is sputtering, the CVD (chemical vapor deposition) method, the MBE (molecular beam epitaxy) method and other similar coating methods. In particular, silicon nitride, aluminum nitride, boron nitride, silicides, carbides, borides and the like as well as amorphous carbon layers and/or a diamond coating for the sputtering and similar, aforementioned deposition methods.

It can be advantageous on a case-by-case basis to provide only the (electrode) fingers with the inventively provided hard layer and to provide a full correction of the electrically conductive material for the bus bars connecting the fingers.

For facultative coating extending beyond the electrode structures, care must be exercised to see that the bond areas usually provided on the substrate surface are left free for the following bonding of the lead wires, unless subsequently freeing these bond areas is preferred. Such layers, particularly layers that have been sputtered on as cited above, preferably have a thickness between 30 nm and 150 nm for an overall thickness of, for example, 400 nm.

Yet another alternative relevant to the invention is to implement such an inventively provided hard layer over the electrode structures in the as yet open housing only after the installation of the substrate lamina in the component housing and after the bonding of the terminals.

Adhering to the thickness ratio of hard layer to conductive part of the finger structures and, preferably, the adaptation of the angular part θ of the angle Δ in turn also applies to these alternatives of applying the inventive, hard layer.

As an excerpt in the section A–B (FIG. 1), FIG. 2 shows the substrate body 10 with fingers 112 of an electrode structures 12 arranged on its surface and with the inventively provided hard layer 21 respectively inventively provided on the electrically conductive part 112' thereof. In particular, this is an anodically oxidized aluminum oxide layer (the exposed surface of the fingers 112).

Like FIG. 2, FIG. 3 shows an alternative embodiment of an inventively provided hard layer 121 that is applied by, for example, sputtering. As the plan view of FIG. 4 also shows, this layer 121 can thereby also extend more or less onto surface portions of the substrate surface 11 that are not covered by the electrode structures 12, particularly in their environment. The degree of such an extent beyond the electrode structures 12 is to be selected weighed against possible negative influences such as attenuation and the like.

D references the overall thickness of the electrode structure 12 or, of the fingers 112, and d1 or, d'1 references the thickness of the electrically conductive (aluminum) part 112', and d2 or, respectively, d'2 references the thickness of the hard layer 21 or, respectively, 121.

Figure 6:
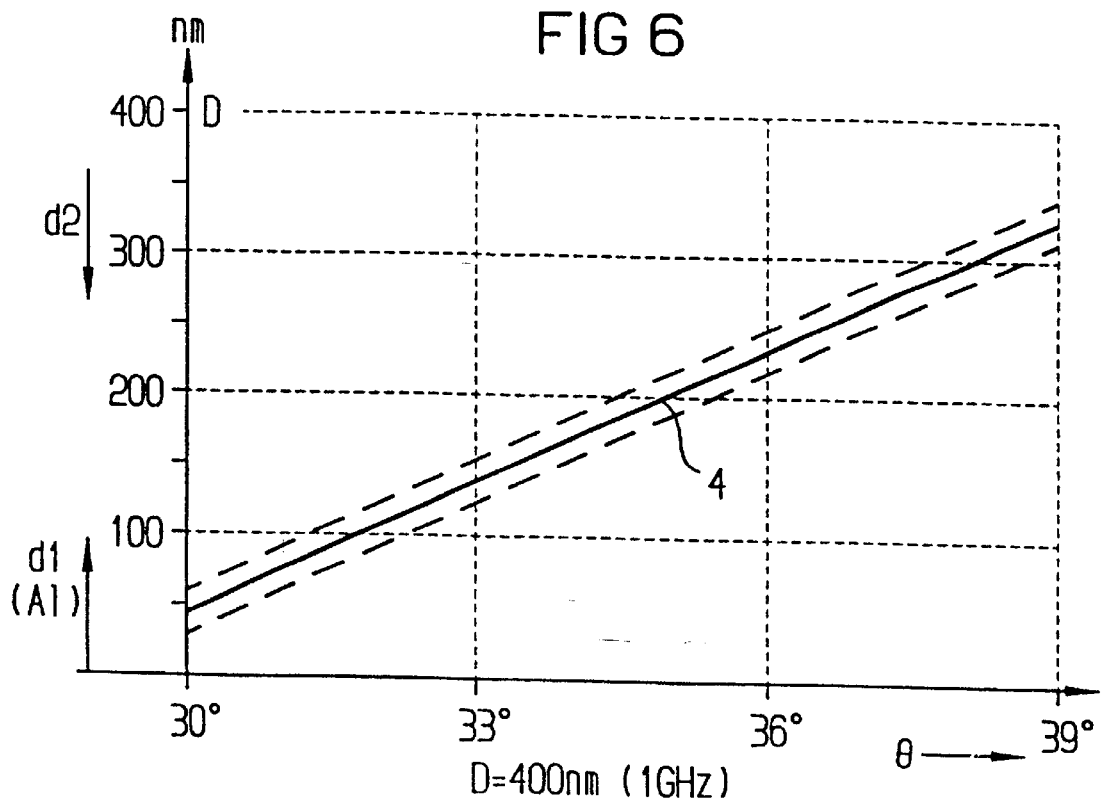

On the abscissa, FIG. 5 shows the part of the thickness (d1 in FIG. 2) of the aluminum of the electrode structure/fingers with reference to the overall thickness D of the fingers (400 nm for example 1 GHz or, respectively, 200 nm for 2 GHz). The degree of wave attenuation is entered on the ordinate. The curves 1, 2, 3 are valid for the three indicated crystal sections that differ from one another. How large the angle Δ for a selected thickness d1 of the aluminum share in the overall thickness D or, what thickness ratio d1:d2 is to be inventively selected given a crystal section with predetermined angle Δ can be seen (potentially also interpolated) from this illustration of FIG. 5. FIG. 6 shows the interpolated curve 4 for thickness ratios to be respectively selected for crystal sections of Δ=210° through Δ=218°, namely in order to achieve the stated object with the teaching of the invention. The optimum dimensions for mutually dependent crystal section angle Δ and thickness ratio d1:d2, referred to the optimum overall thickness D of the fingers or, electrode structure predetermined by the given operating frequency, that satisfy the invention lie in a tolerance strip along the interpolation curve 4.

Figure 5A:
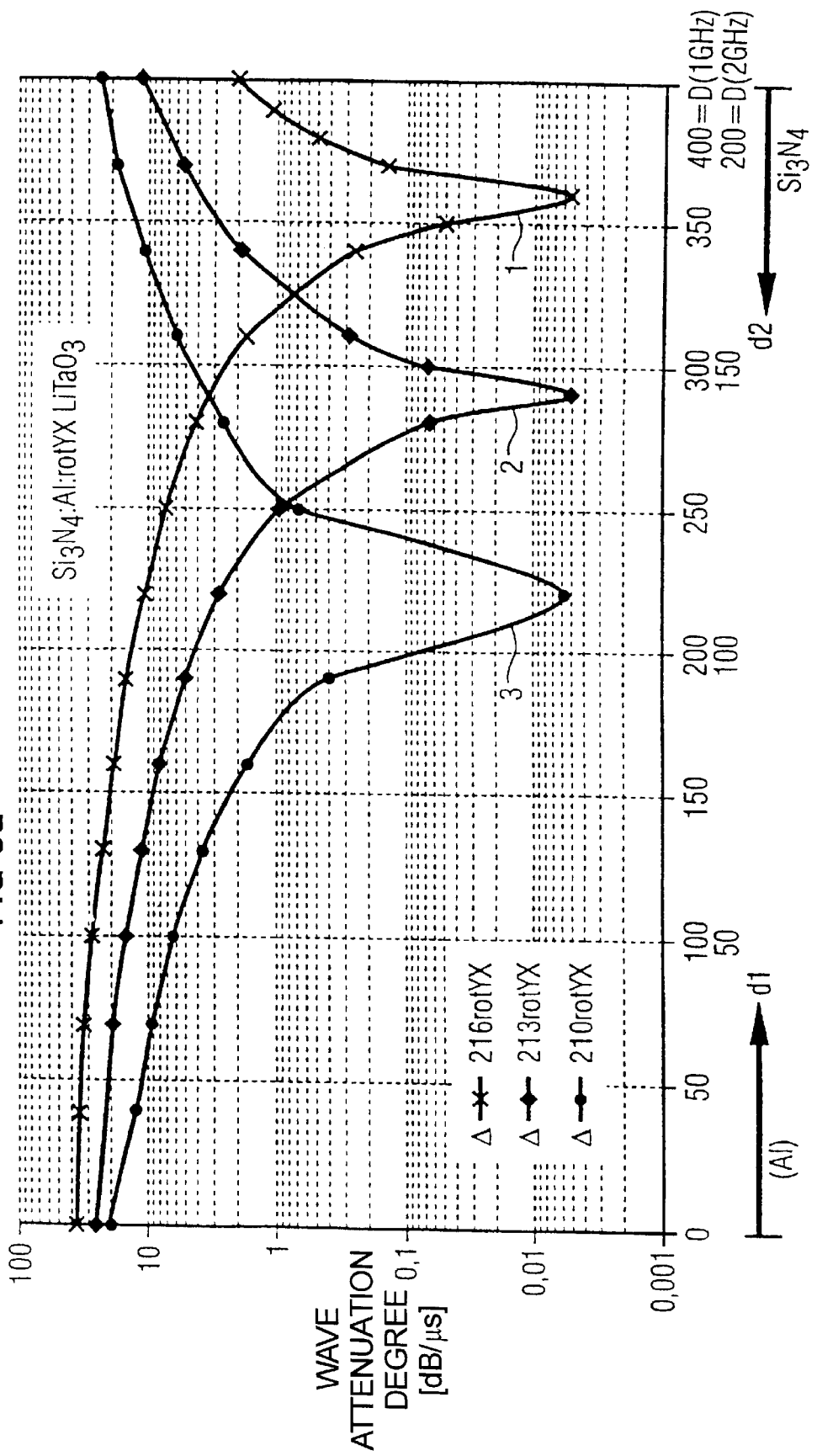

FIGS. 5 and 6 indicate the dimensions for lithium tantalate crystal. Corresponding graphs are valid for, for example, lithium niobate with respectively somewhat divergent numerical values but, fundamentally, the same behavior of the curves (FIG. 5) and of the interpolation line ( 4 in FIG. 6). The angles of the attenuation minimums for silicon nitride as hard layer can be derived from FIG. 5*a* (for FIG. 2).

The particulars and dimensioning guidelines of FIGS. 5 and 6 essentially apply quantitatively for an embodiment having (as in FIG. 2) a hard layer on only the fingers 112 with (at least largely) free substrate 11 between the fingers 112. However, they continue to apply qualitatively to an embodiment according to FIG. 3. Given, for example, a ratio of finger width to finger period length of 0.5 to 1 (=metallization ratio η=0.5), an inventively hard coating of the substrate surface 11 that is continuous across the fingers as in FIG. 3 should not be thicker than (d'2=0.3×D) 30% of the given overall thickness. Given, for example, a crystal section 36° for 1 GHz with D=400 nm, the thickness d'2 of the hard layer would be reduced from 150 nm in FIG. 2 to 75 nm for an embodiment of FIG. 3 given a metallization ratio of 0.5 in order to continue to achieve optimum, slight leakage wave losses.

For a higher metallization ratio, for example 0.7, the optimum dimensioning d'2 is to be reduced by only about 30% to about 105 nm. The intermediate values can be analogously estimated for the individual case from these particulars.

The following dimensioning guidelines can be recited: Given an embodiment according to FIG. 3 with deposited layer 121 and a metallization ratio η of 0.4 through 0.8 and an overall thickness D=d'1+d'2=0.03 through 0.15 times the wavelength of the surface acoustic wave, it is at least approximately valid that the maximum thickness d'2 of the layer 121 on the electrically conductive part 112' of the fingers, dependent of the size of the existing metallization ratio, is to be dimensioned reduced compared to the thickness values d2 to be derived from FIGS. 5, 5*a* and 6 for the layer (21) covering only the fingers 112, i.e. not their environment as well, as in the exemplary embodiment of FIG. 2, namely d'2=η×d2.

A corresponding reduction equation $$d'1:d'2 = \frac{(d1:d2)+(1-\eta)}{\eta}$$

can also be recited, wherein d1 and d2 are value pairs with corresponding angle θ that derive from FIGS. 5, 5*a* and 6 for an embodiment according to FIG. 2 with respect thereto.

In addition to being applicable for the indicated crystal materials, the invention can also be applied to further crystal materials having such a crystal section of the surface 11 provided for the electrode structures that the axis c=z for the pyroelectrical axis is oriented into the substrate lamina 10 (rotational angle D greater more than 180° and smaller less 390°).

Although various minor changes and modifications might be proposed by those skilled in the art, it will be understood that my wish is to include within the claims of the patent warranted hereon all such changes and modifications as reasonably come within my contribution to the art.

I claim:

1. A surface acoustic wave component, comprising:
   an electrode structure formed of fingers having aluminum as at least a principal material constituent on a surface having a surface normal of a pyroelectric and piezoelectric crystal substrate lamina of lithium tantalate; and
   said surface being a crystal section such that said surface charges electrically positive given heating of the substrate lamina as a result of a pyroelectric effect, and a crystal section rotated around an x1=x-axis as a direction of wave propagation with an angle Δ=(180°+θ) between a positive y-axis and the surface normal, where Δ has a range 180°+25°<Δ<180°+46° for low leakage wave losses for lithium tantalate crystal sections.

2. The component according to claim 1, whereby the angle Δ is dimensioned with $$180°+33° < \Delta < 180°+37°.$$

3. The component according to claim 1 whereby
   a layer that is hard compared to the electrically conductive material of the electrode structures as fingers is provided at a surface of the electrode structure as fingers; and
   a thickness ratio of electrically conductive material of the electrode structure as fingers and a material of the hard layer is selected given optimum overall thickness of the electrode structure as fingers predetermined by a given operating frequency such that increased power compatibility is achieved.

4. The component according to claim 3 whereby said thickness ratio and said angle Δ are selected dependent on one another such that optimally increased power compatibility is achieved with the hard layer.

5. The component according to claim 4, whereby said hard layer is composed of anodically oxidized aluminum of aluminum of the electrode structure.

6. The component according to claim 5, whereby a thickness of the aluminum oxide layer comprises 10% through 80% of a thickness of the electrode structure including the hard layer.

7. The component according to claim 3 whereby said hard layer is deposited on a surface of the electrode structure.

8. The component according to claim 7 whereby a deposition of the hard layer occurs by sputtering.

9. The component according to claim 8 whereby the hard layer is composed of a nitride of at least one of silicon, aluminum and boron.

10. The component according to claim 8 whereby the hard layer is composed of a silicide.

11. The component according to claim 8 whereby the hard layer is composed of a boride.

12. The component according to claim 8 whereby the hard layer is composed of a carbide.

13. The component according to claim 8 whereby the hard layer is an amorphous carbon layer.

14. The component according to claim 8 whereby the hard layer is a diamond layer.

15. The component according to claim 3 comprising an aluminum oxide layer on free surfaces of at least the fingers of the electrode structures, the individual fingers having an overall thickness of D=0.03 through 0.15 times a wavelength of the surface acoustic wave, whereby D=d1+d2 is valid,
with
- d1 a thickness of the conductive material of the fingers, and
- d2 a thickness of the layer on the fingers, and whereby the following is at least approximately valid:
  d1:d2=0.1 given an angle θ=30°, and
  d1:d2=2.5 given an angle θ=38°, with dependency essentially linear thereto for intermediate values of thickness ratios d1:d2 to be derived therefrom for values of the angle θ between 30° and 38° for optimum power compatibility.

16. The component according to claim 3 wherein an angle θ of orientation is between greater than 35° and less than 38° given a thickness ratio d1:d2 of at least approximately 3:1.

17. The component according to claim 3 comprising a layer deposited over the electrode structure as fingers and on the substrate surface in at least an immediate environment thereof with a metallization ratio η from 0.2 through 0.8 and an overall thickness D=d'1+d2=0.03 through 0.15 times a wavelength of the surface acoustic wave,
whereby the thickness d'1 is of the electrically conductive part of the fingers and d'2 is a thickness of the deposited layer and the following is at least approximately valid:
that, dependent on a size of the existing metallization ratio, a maximum thickness d'2 of the layer on the electrically conductive part is to be dimensioned in reduced fashion compared to a thickness value d2 to be derived from the hardness layer covering only the fingers d'2=η×d1.

18. The component according to claim 3 comprising a layer deposited over the electrode structure as fingers and on a substrate surface in at least an immediate environment thereof with a metallization ratio η from 0.2 through 0.8 and an overall thickness D=d'1+d2=0.03 through 0.15 times a wavelength of the surface acoustic wave,
whereby D=d'1+d'2 with the thickness d'1 is of the electrically conductive part of the fingers and d'2 is the thickness of the deposited layer and the following is at least approximately valid:

$$d'1:d'2 = \frac{(d1:d2) + (1-\eta)}{\eta}$$

wherein d1 and d2 are value pairs with a corresponding angle θ.

19. A surface acoustic wave component, comprising:
an electrode structure formed of fingers of aluminum as at least a principal material constituent on a surface having a surface normal of a pyroelectric and piezoelectric crystal substrate lamina of lithium niobate;
and said surface is a crystal section such that said surface charges electrically positive given heating of the substrate lamina as a result of a pyroelectric effect, and a crystal section rotated around an x1=x-axis as a direction of the wave propagation with an angle Δ=180°+θ between a positive y-axis and the surface normal, where Δ has a range 180°+60°<Δ<180°+74° for low leakage wave losses for lithium niobate crystal sections.

20. The component according to claim 19 whereby
a layer that is hard compared to the electrically conductive material of the electrode structures as fingers is provided at a surface of the electrode structure as fingers; and
a thickness ratio of electrically conductive material of the electrode structure as fingers and a material of the hard layer is selected given optimum overall thickness of the electrode structure as fingers predetermined by a given operating frequency such that increased power compatibility is achieved.

21. The component according to claim 20 whereby said thickness ratio and said angle Δ are selected dependent on one another such that optimally increased power compatibility is achieved with the hard layer.

22. The component according to claim 21 whereby said hard layer is composed of anodically oxidized aluminum of aluminum of the electrode structure.

23. The component according to claim 22 whereby a thickness of the aluminum oxide layer comprises 10% through 80% of a thickness of the electrode structure, including the hard layer.

24. The component according to claim 20 whereby said hard layer is deposited on a surface of the electrode structure.

25. The component according to claim 24 whereby a deposition of the hard layer occurs by sputtering.

26. The component according to claim 25 whereby the hard layer is composed of a nitride of at least one of silicon, aluminum and boron.

27. The component according to claim 25 whereby the hard layer is composed of a silicide.

28. The component according to claim 25 whereby the hard layer is composed of a boride.

29. The component according to claim 25 whereby the hard layer is composed of a carbide.

30. The component according to claim 25 whereby the hard layer is an amorphous carbon layer.

31. The component according to claim 25 whereby the hard layer is a diamond layer.

32. The component according to claim 22, whereby a thickness of the aluminum oxide layer comprises 10% through 80% of a thickness of the electrode structure including the hard layer.

33. The component according to claim 20 whereby said hard layer is deposited on a surface of the electrode structures.

34. The component according to claim 33 whereby a deposition of the hard layer occurs by sputtering.

35. The component according to claim 34 whereby the hard layer is composed of a nitride of at least one of silicon, aluminum and boron.

36. The component according to claim 34 whereby the hard layer is composed of a silicide.

37. The component according to claim 34 whereby the hard layer is composed of a boride.

38. The component according to claim 34 whereby the hard layer is composed of a carbide.

39. The component according to claim 34 whereby the hard layer is an amorphous carbon layer.

40. The component according to claim 34 whereby the hard layer is a diamond layer.

41. The component according to claim 20 wherein an angle θ of orientation is between greater than 35° and less than 38° given a thickness ratio d1:d2 of at least approximately 3:1.

42. The component according to claim 20 comprising a layer deposited over the electrode structures as fingers and on the substrate surface in at least an immediate environment thereof with a metallization ratio η from 0.2 through 0.8 and an overall thickness D=d'1+d2=0.03 through 0.15 times a wavelength of the surface acoustic wave, whereby the thickness d'1 is of the electrically conductive part of the fingers and d'2 is a thickness of the deposited layer and the following is at least approximately valid: that, dependent on a size of the existing metallization ratio, a maximum thickness d'2 of the layer on the electrically conductive part is to be dimensioned in reduced fashion compared to a thickness value d2 to be derived from the hardness layer covering only the fingers d'2=η×d1.

43. The component according to claim 20 comprising a layer deposited over the electrode structure as fingers and on a substrate surface in at least an immediate environment thereof with a metallization ratio η from 0.2 through 0.8 and an overall thickness D=d'1+d2=0.03 through 0.15 times a wavelength of the surface acoustic wave, whereby D=d'1+d'2 with the thickness d'1 is of the electrically conductive part of the fingers and d'2 is the thickness of the deposited layer and the following is at least approximately valid:

$$d'1:d'2 = \frac{(d1:d2)+(1-\eta)}{\eta}$$

wherein d1 and d2 are value pairs with a corresponding angle θ.

44. A surface acoustic wave component, comprising:

an electrode structure having fingers formed of aluminum as at least a principal material constituent on a surface having a surface normal of a pyroelectric and piezoelectric crystal substrate lamina of potassium niobate;

said surface being a crystal section such that the surface charges electrically positive given heating of the substrate lamina as a result of a pyroelectric effect, and a crystal section rotated around an x1=x-axis as a direction of wave propagation with an angle Δ=180°θ between a positive y-axis and the surface normal, wherein θ is a known angle for low leakage wave losses for potassium niobate crystal sections;

a layer that is hard compared to the electrically conductive material of the electrode structure as the fingers is provided at a surface of the electrode structure as the fingers;

a thickness ratio of electrically conductive material of the electrode structure as the fingers and a material of the hard layer is selected given optimum overall thickness of the electrode structure as the fingers predetermined by a given operating frequency such that increased power compatibility is achieved; and an aluminum oxide layer on free surfaces of at least the fingers of the electrode structure, the individual fingers having an overall thickness of D=0.03 through 0.15 times a wavelength of the surface acoustic wave, whereby D=d1+d2 is valid, with d1 a thickness of the conductive material of the fingers, and d2 a thickness of the layer on the fingers, and whereby the following is at least approximately valid:

d1:d2=0.1 given an angle θ=30°, and d1:d2=2.5 given an angle θ=38°, with dependence essentially linear thereto for intermediate values of thickness ratios d1:d2 to be derived therefrom for values of the angle θ between 30° and 38° for optimum power compatibility.

45. A surface acoustic wave component, comprising:

an electrode structure having fingers formed of aluminum as at least a principal material constituent on a surface having a surface normal of a pyroelectric and piezoelectric crystal substrate lamina of potassium niobate;

said surface being a crystal section such that the surface charges electrically positive given heating of the substrate lamina as a result of a pyroelectric effect, and a crystal section rotated around an x1=x-axis as a direction of wave propagation with an angle Δ=180° +θ between a positive y-axis and the surface normal, wherein θ is a known angle for low leakage wave losses for potassium niobate crystal sections;

a layer that is hard compared to the electrically conductive material of the electrode structure as the fingers is provided at a surface of the electrode structure as the fingers;

a thickness ratio of electrically conductive material of the electrode structure as the fingers and a material of the hard layer is selected given optimum overall thickness of the electrode structure as the fingers predetermined by a given operating frequency such that increased power compatibility is achieved; and an angle θ of orientation being between greater than 35° and less than 38° given a thickness ratio d1:d2 of at least approximately 3:1.

46. A surface acoustic wave component, comprising:

an electrode structure having fingers formed of aluminum as at least a principal material constituent on a surface having a surface normal of a pyroelectric and piezoelectric crystal substrate lamina of potassium niobate;

said surface being a crystal section such that the surface charges electrically positive given heating of the substrate lamina as a result of a pyroelectric effect, and a crystal section rotated around an x1=x-axis as a direction of wave propagation with an angle Δ=180°+θ between a positive y-axis and the surface normal, wherein θ is a known angle for low leakage wave losses for potassium niobate crystal sections;

a layer that is hard compared to the electrically conductive material of the electrode structure as the fingers is provided at a surface of the electrode structure as the fingers;

a thickness ratio of electrically conductive material of the electrode structure as the fingers and a material of the hard layer is selected given optimum overall thickness of the electrode structure as the fingers predetermined by a given operating frequency such that increased power compatibility is achieved; and a layer deposited over the electrode structure as the fingers and on the substrate surface in at least an immediate environment thereof with a metallization ratio η from 0.2 through 0.8 and an overall thickness D=d'1+d2=0.03 through 0.15 times a wavelength of the surface acoustic wave, whereby the thickness d'1 is of the electrically conductive part of the fingers and d'2 is a thickness of the deposited layer and the following is at least approximately valid: that, dependent on a size of the existing metallization ratio, a maximum thickness of d'2 of the layer on the electrically conductive part is to be dimensioned in reduced fashion compared to a thickness value d2 to be derived from the hardness layer covering only the fingers d'2=η×d1.

47. A surface acoustic wave component, comprising:
an electrode structure having fingers formed of aluminum as at least a principal material constituent on a surface having a surface normal of a pyroelectric and piezoelectric crystal substrate lamina of potassium niobate;
said surface being a crystal section such that the surface charges electrically positive given heating of the substrate lamina as a result of a pyroelectric effect, and a crystal section rotated around an x1=x-iaxis after a direction of wave propagation with an angle Δ=180°+θ between a positive y-axis and the surface normal, wherein θ is a known angle for low leakage wave losses for potassium niobate crystal sections;
a layer that is hard compared to the electrically conductive material of the electrode structure as the fingers is provided at a surface of the electrode structure as the fingers;
a thickness ratio of electrically conductive material of the electrode structure as the fingers and a material of the hard layer is selected given optimum overall thickness of the electrode structure as the fingers predetermined by a given operating frequency such that increased power compatibility is achieved; and
a layer deposited over the electrode structure as the fingers and on a substrate surface in at least an immediate environment thereof with a metallization ratio η from 0.2 through 0.8 and an overall thickness D=d'1+d2=0.03 through 0.15 times a wavelength of the surface acoustic wave,
whereby D=d'1+d'2 with the thickness d'1 is of the electrically conductive part of the fingers and d'2 is the thickness of the deposited layer and the following is at least approximately valid:

$$d'1 : d'2 = \frac{(d1 : d2) + (1 - \eta)}{\eta}$$

wherein d1 and d2 are value pairs with a corresponding angle θ.

48. A surface acoustic wave component, comprising:
an electrode structure formed of fingers having aluminum as at least a principal material constituent on a surface having a surface normal of a pyroelectric and piezoelectric crystal substrate lamina of lithium niobate;
and said surface being a crystal section such that said surface charges electrically positive given heating of the substrate lamina as a result of a pyroelectric effect, and a crystal section rotated around an x1=x-axis as a direction of wave propagation with an angle Δ=(180°+θ) between a positive y-axis and the surface normal, where Δ has a range 180°+25°<Δ<180°+46° for low leakage wave losses for lithium niobate crystal sections.

49. The component according to claim 48 whereby
a layer that is hard compared to the electrically conductive material of the electrode structures as fingers is provided at a surface of the electrode structure as fingers; and
a thickness ratio of electrically conductive material of the electrode structure as fingers and a material of the hard layer is selected given optimum overall thickness of the electrode structure as fingers predetermined by a given operating frequency such that increased power compatibility is achieved.

50. The component according to claim 49 whereby said thickness ratio and said angle Δ are selected dependent on one another such that optimally increased power compatibility is achieved with the hard layer.

51. The component according to claim 50, whereby said hard layer is composed of anodically oxidized aluminum of aluminum of the electrode structure.

52. The component according to claim 51, whereby a thickness of the aluminum oxide layer comprises 10% through 80% of a thickness of the electrode structure, including the hard layer.

53. The component according to claim 49 whereby said hard layer is deposited on a surface of the electrode structure.

54. The component according to claim 53 whereby a deposition of the hard layer occurs by sputtering.

55. The component according to claim 54 whereby the hard layer is composed of a nitride of at least one of silicon, aluminum and boron.

56. The component according to claim 54 whereby the hard layer is composed of a silicide.

57. The component according to claim 54 whereby the hard layer is composed of a boride.

58. The component according to claim 54 whereby the hard layer is composed of a carbide.

59. The component according to claim 54 whereby the hard layer is an amorphous carbon layer.

60. The component according to claim 54 whereby the hard layer is a diamond layer.

61. The component according to claim 49 wherein an angle θ of orientation is between greater than 35° and less than 38° given a thickness ratio d1:d2 of at least approximately 3:1.

62. The component according to claim 49 comprising a layer deposited over the electrode structure as fingers and on the substrate surface in at least an immediate environment thereof with a metalization ratio η from 0.2 through 0.8 and an overall thickness D=d'1+d2=0.03 through 0.15 times a wavelength of the surface acoustic wave,
whereby the thickness d'1 is of the electrically conductive part of the fingers and d'2 is a thickness of the deposited layer and the following is at least approximately valid:
that, dependent on a size of the existing metalization ratio, a maximum thickness d'2 of the layer on the electrically conductive part is to be dimensioned in reduced fashion compared to a thickness value d2 to be derived from the hardness layer covering only the fingers d'2=η×d1.

63. The component according to claim 49 comprising a layer deposited over the electrode structure as fingers and on a substrate surface in at least an immediate environment thereof with a metalization ratio η from 0.2 through 0.8 and an overall thickness D=d'1+d2=0.03 through 0.15 times a wavelength of the surface acoustic wave,
whereby D=d'1+d'2 with the thickness d'1 is of the electrically conductive part of the fingers and d'2 is the thickness of the deposited layer and the following is at least approximately valid:

$$d'1 : d'2 = \frac{(d1 : d2) + (1 - \eta)}{\eta}$$

wherein d1 and d2 are value pairs with a corresponding angle θ.

* * * * *